(12) United States Patent
Guo et al.

(10) Patent No.: US 7,969,737 B2
(45) Date of Patent: Jun. 28, 2011

(54) HEAT DISSIPATION APPARATUS

(75) Inventors: Qing-Lei Guo, Shenzhen (CN); Shou-Li Zhu, Shenzhen (CN); Ming Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 250 days.

(21) Appl. No.: 12/430,843

(22) Filed: Apr. 27, 2009

(65) Prior Publication Data

US 2010/0122796 A1   May 20, 2010

(30) Foreign Application Priority Data

Nov. 14, 2008  (CN) .......................... 2008 1 0305562

(51) Int. Cl.
*H05K 7/20* (2006.01)
(52) U.S. Cl. ................... 361/700; 361/679.47; 361/719; 165/80.4; 165/104.33
(58) Field of Classification Search .................... None
See application file for complete search history.

(56) References Cited

U.S. PATENT DOCUMENTS

| 7,532,472 | B2* | 5/2009 | Lin et al. ........................ 361/697 |
| 7,576,987 | B2* | 8/2009 | Lai et al. ........................ 361/704 |
| 7,643,293 | B2* | 1/2010 | Chu ................................ 361/700 |
| 7,760,501 | B2* | 7/2010 | Zha et al. ........................ 361/697 |
| 7,796,387 | B2* | 9/2010 | Deng et al. ..................... 361/697 |
| 7,802,616 | B2* | 9/2010 | Chen et al. ................. 165/104.33 |
| 2007/0044942 | A1* | 3/2007 | Mou ......................... 165/104.33 |
| 2008/0202729 | A1* | 8/2008 | Mochizuki ............... 165/104.14 |
| 2009/0242176 | A1* | 10/2009 | Liu et al. .................. 165/104.33 |
| 2010/0230074 | A1* | 9/2010 | Li ............................... 165/80.3 |

* cited by examiner

*Primary Examiner* — Boris L Chervinsky
(74) *Attorney, Agent, or Firm* — Frank R. Niranjan

(57) ABSTRACT

A heat dissipation apparatus includes a heat absorbing base, a heat conductive core, two fin assemblies and two heat pipes. The heat conductive core is attached to the heat absorbing base, and includes an elliptical, cylindrical body having an elliptical, cylindrical side surface. The two fin assemblies are located at two opposite sides of a major axis of the heat conductive core, respectively, and attached to the side surface of the heat conductive core. The two heat pipes connect the two fin assemblies with the heat absorbing base, respectively, transferring heat from the heat absorbing base to the fin assemblies.

12 Claims, 2 Drawing Sheets

HEAT DISSIPATION APPARATUS

BACKGROUND

1. Technical Field

The disclosure generally relates to heat dissipation apparatuses, and particularly to a heat dissipation apparatus for dissipating heat generated by electronic components with a high heat dissipating efficiency.

2. Description of Related Art

It is well-known that heat is generated by electronic components such as central processing units (CPUs) of computers. If the generated heat is not rapidly and efficiently removed, the electronic component may overheat and the performance thereof may be significantly degraded.

Conventionally, a heat dissipation apparatus is attached to an electronic component for removing heat generated by the electronic component. The heat dissipating apparatus includes a heat absorbing plate thermally contacted with the electronic component and a plurality of fins extending upwardly from the heat absorbing plate. Heat generated by the electronic component is transferred to the fins through the heat absorbing plate and dissipated to the ambient environment by the fins. However, the above-mentioned heat dissipation apparatus, which transfers heat via heat conduction means, is no longer capable of satisfying the heat dissipating requirement of the advanced electronic components.

What is needed, therefore, is a heat dissipation apparatus with a high heat dissipating efficiency, which overcomes the described limitations.

BRIEF DESCRIPTION OF THE DRAWINGS

Many aspects of the present heat dissipation apparatus can be better understood with reference to the following drawings. The components in the drawings are not necessarily drawn to scale, the emphasis instead being placed upon clearly illustrating the principles of the disclosed heat dissipation apparatus. Moreover, in the drawings, like reference numerals designate corresponding parts throughout the several views.

DETAILED DESCRIPTION

Figure 1:
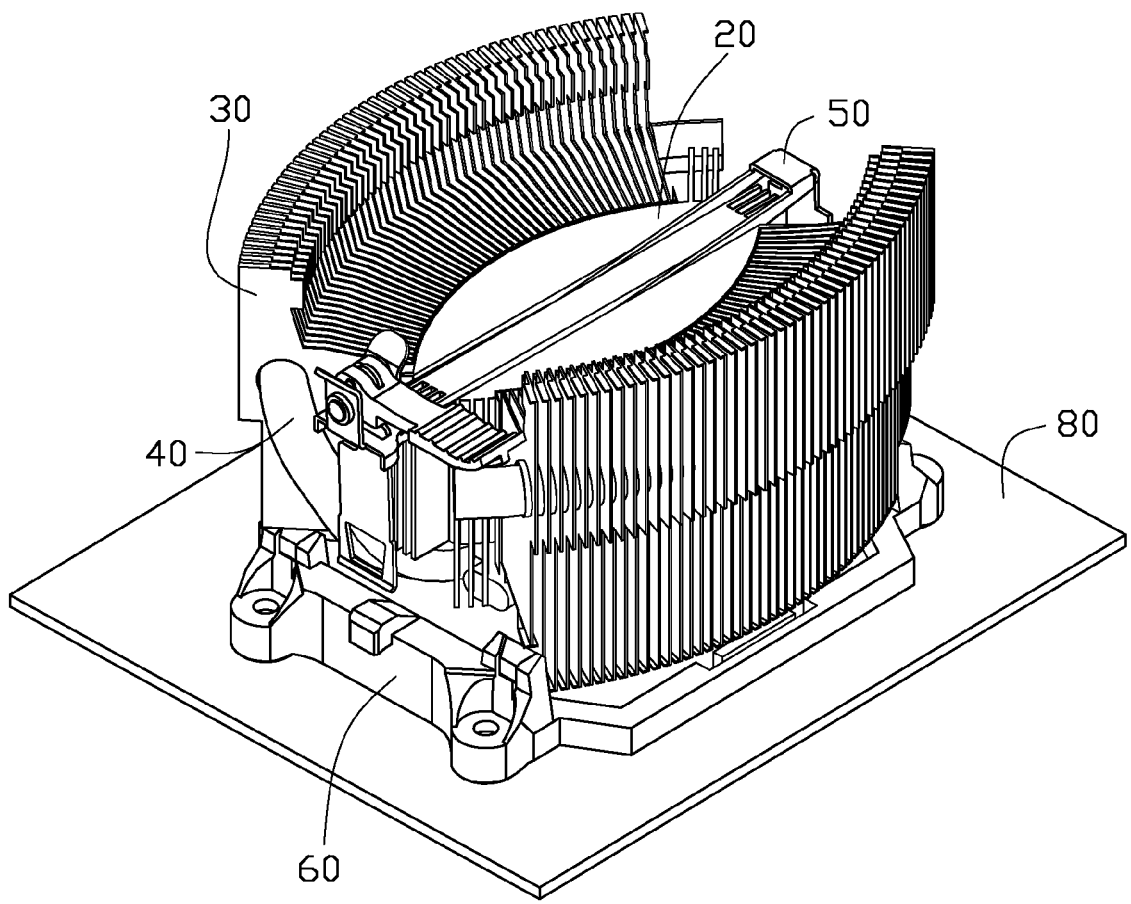
FIG. 1 is an assembled, isometric view of a heat dissipation apparatus in accordance with an exemplary embodiment of the disclosure.
Figure 2:
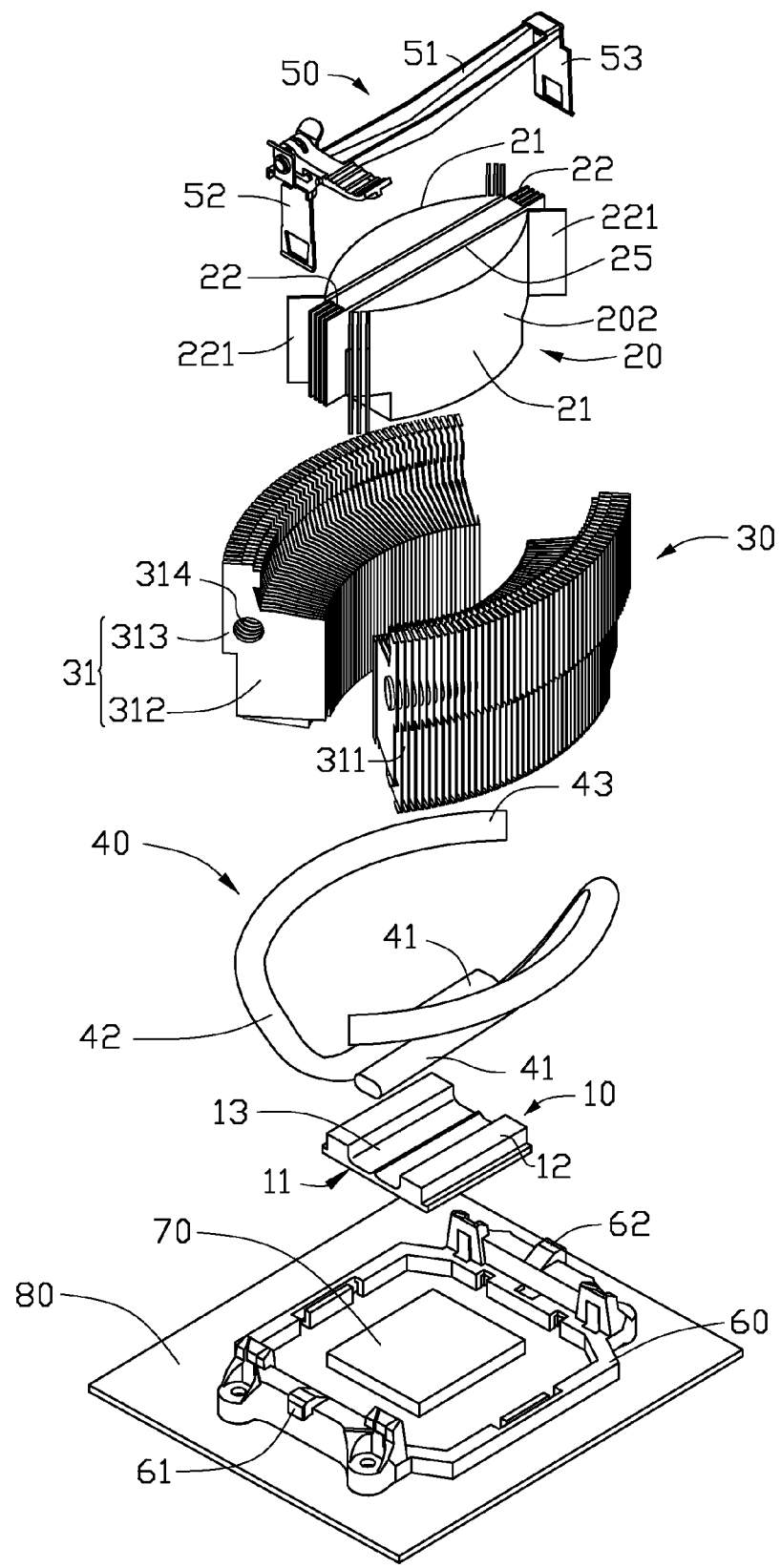
FIG. 2 is an exploded, isometric view of the heat dissipation apparatus of FIG. 1.

Referring to FIGS. 1 and 2, a heat dissipation apparatus in accordance with an exemplary embodiment includes a heat absorbing base 10, a heat conductive core 20, two fin assemblies 30, two heat pipes 40, a securing member 50 and a retention frame 60. The heat dissipation apparatus is positioned on an electronic component 70, such as a CPU, which is mounted on a printed circuit board 80, for dissipating heat generated by the electronic component 70. The securing member 50 is used to secure the heat dissipation apparatus to the electronic component 70.

The heat absorbing base 10 is a rectangular metal plate, and has an excellent heat conductivity. Preferably, the heat absorbing base 10 is made of copper or aluminum. The heat absorbing base 10 has a planar bottom surface 11 thermally connecting with the electronic component 70 and a top surface 12 opposite to the bottom surface 11. Generally, a layer of thermally interface material is filled between the electronic component 70 and the bottom surface 11 of the heat absorbing base 10 to reduce the thermal resistance therebetween. Two parallel mounting grooves 13 are defined in the top surface 12 of the heat absorbing base 10 for accommodating the heat pipes 40.

The heat conductive core 20 is made of material with excellent heat conductivity such as copper or aluminum. A bottom surface of the heat conductive core 20 is attached on the top surface 12 of the heat absorbing base 10. Heat generated by the electronic component 70 is transferred vertically and upwardly to the heat conductive core 20 via the heat absorbing base 10. The heat conductive core 20 includes a body 202 and a plurality of fins 221. The body 202 has a configuration of a substantially elliptic cylinder, and includes a top surface, a bottom surface, and a side surface between the top and bottom surface. The top and bottom surfaces are parallel to each other, and are elliptical. The side surface includes two opposite first arcuate sections 21 and two opposite second arcuate sections 22. The two first arcuate sections 21 are located at two opposite sides of a major axis of the body 202, and the two second arcuate sections 22 are located at two opposite sides of a minor axis of the body 202. The second arcuate section 22 has a curvature larger than that of the first arcuate section 21. The fins 221 of the heat conductive core 20 extend radially and outwardly from the second arcuate sections 22. The top surface of the body 202 defines a pair of elongated locating grooves 25 along the major axis thereof for receiving the securing member 50 therein.

Each of the two fin assemblies 30 is substantially sectorial, and includes a plurality of stacked fins 31. An air passage 311 is defined between every two adjacent fins 31. Each fin 31 is made of material with excellent heat conductivity such as copper or aluminum, and includes a rectangular main body 312 and an extension arm 313 extending upwardly from an outer portion of a top side of the main body 312. Each fin 31 defines a receiving hole 314 therein near a joint of the main body 312 and the extension arm 313. All of the receiving holes 314 of the fins 31 of the fin assembly 30 cooperatively form an arcuate channel for receiving a section of the heat pipe 40 therein. Inner sides of the main bodies 312 of the fins 31 of the fin assembly 30 together form an arcuate surface corresponding to the first arcuate section 21 of the heat conductive core 20. The two fin assemblies 30 are respectively attached to the two first arcuate sections 21 of the heat conductive core 20 by soldering or heat conducting adhesive.

The heat pipes 40 are used for transferring heat from the heat absorbing base 10 to the fin assemblies 30 by phase change. Each heat pipe 40 includes a sealed hollow pipe body receiving working fluid therein and a wick structure disposed on an inner wall of the pipe body. The heat pipe 40 is bent to have an evaporation section 41, a condensation section 43, and an adiabatic section 42 interconnecting the evaporation section 41 and the condensation section 43. The evaporation section 41 of each heat pipe 40 is straight and flat, and is mounted in a corresponding groove 11 of the heat absorbing base 10. The evaporation section 41 of each heat pipe 40 and the heat absorbing base 10 are combined together by soldering or heat conducting adhesive. Thus, the bottom surface of the heat conductive core 20 can contact with the heat absorbing base 10 and the evaporation section 41 of each heat pipe 40 at the same time. A top surface of the evaporation section 41 of each heat pipe 40 is substantially coplanar with the top surface 12 of the heat absorbing base 10. The adiabatic section 42 extends upwardly and slantwise from one end of the evaporation section 41. The adiabatic sections 42 of the two heat pipes 40 are located at two opposite sides of the minor axis of the heat absorbing base 10, respectively. The condensation section 43 is substantially arcuate, and extends from a free end of the adiabatic section 42 clockwise. The condensation sections 43 of the two heat pipes 40 are respectively located at two opposite sides of the major axis of the heat conductive core 20, and respectively received in the arcuate channels of the fin assemblies 30. In this embodiment, the condensation section 43 of the heat pipe 40 and the first arcuate section 21 of the heat conductive core 20 are homocentric. Thus, a distance between the condensation section 43 and the corresponding first arcuate section 21 of the heat conductive core 20 is invariable, which makes the combination of fin assembly 30 and the heat pipe 40 feasible and convenient.

The electronic component 70 is surrounded by the retention frame 60 which is securely mounted on the printed circuit board 80. The retention frame 60 is substantially rectangular shaped. A pair of catches 61, 62, i.e., first catch 61 and second catch 62 extend outwardly from two opposite sides of the retention frame, respectively.

The securing member 50 includes an elongated pressing portion 51 extending along the major axis of the heat conductive core 20, a first locking leg 53 integrally formed with and bent perpendicularly from a rear end of the pressing portion 51, and a moveable second locking leg 52 movably coupled with a front end of the pressing portion 51. The pressing portion 51 includes a pair of elongated resilient arms received in the locating grooves 25 of the heat conductive core 20. In assembly, the heat dissipation apparatus is placed on the electronic component 70. The first and second locking legs 53, 52 of the securing member 50 are coupled to the first and second catches 61, 62 of the retention frame 60, respectively.

In the heat dissipation apparatus, due to the presence of the heat pipes 40 and the heat conductive core 20, heat absorbed by the heat absorbing base 10 can be transferred to the fin assemblies 30 not only via the heat conductive core 20, but also via the heat pipes 40. The heat dissipating efficiency of the heat dissipation apparatuses is greatly improved for heat absorbed by liquid having a phase change (i.e. from liquid to vapor) is hundred times more than that of the liquid without phase change, and a heat transfer efficiency by phase change of liquid is much better than heat conduction or heat convection without phase change. In addition, the elliptical, cylindrical surface of the heat conductive core 20 provides a larger heat contacting area to contact with the fin assemblies 30, which further improves the heat dissipating efficiency of the heat dissipation apparatuses.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation apparatus, comprising:
   a heat absorbing base for contacting with an electronic component;
   a heat conductive core attached to the heat absorbing base, the heat conductive core comprising an elliptical, cylindrical body having an elliptical, cylindrical side surface;
   two fin assemblies located at two opposite sides of a major axis of the heat conductive core, respectively, and attached to the side surface of the heat conductive core; and
   two heat pipes connecting the two fin assemblies with the heat absorbing base, respectively, and transferring heat from the heat absorbing base to the fin assemblies.

2. The heat dissipation apparatus of claim 1, wherein the side surface of heat conductive core comprises two opposite first arcuate sections located at the two opposite sides of the major axis of the body, respectively, and two opposite second arcuate sections located at two opposite sides of a minor axis of the body, respectively, each second arcuate section having a curvature larger than that of each first arcuate section, the two fin assemblies being attached to the two first arcuate sections of the heat conductive core, respectively.

3. The heat dissipation apparatus of claim 2, wherein a plurality of fins extend radially and outwardly from each of the two second arcuate sections.

4. The heat dissipation apparatus of claim 2, wherein the heat absorbing base defines two mounting grooves in a top surface thereof, each heat pipe comprising an evaporation section, a condensation section, and an adiabatic section interconnecting the evaporation section and the condensation section, the evaporation section of each heat pipe being received in a corresponding mounting groove of the heat absorbing base, each fin assembly defining an arcuate channel therein, the adiabatic sections of the two heat pipes being located at the two opposite sides of the minor axis of the heat absorbing base, respectively, the condensation section of each heat pipe being received in the arcuate channel of a corresponding fin assembly.

5. The heat dissipation apparatus of claim 2, wherein each fin assembly is substantially sectorial, and comprises a plurality of stacked fins.

6. The heat dissipation apparatus of claim 5, wherein each fin assembly defines an arcuate channel therein, each heat pipe comprising an evaporation section and a condensation section, the evaporation section of each heat pipe being inserted in the heat absorbing base, the condensation section of each heat pipe being received in the arcuate channel of a corresponding fin assembly.

7. The heat dissipation apparatus of claim 6, wherein the condensation section of each heat pipe is substantially arcuate, the condensation section of each heat pipe and the first arcuate section of the heat conductive core are homocentric.

8. The heat dissipation apparatus of claim 6, wherein each fin comprises a rectangular main body and an extension arm extending upwardly from an outer side of a top of the main body.

9. The heat dissipation apparatus of claim 8, wherein each fin defines a receiving hole therein at a joint of the main body and the extension arm, the receiving holes of the fins of the fin assembly cooperatively forming the arcuate channel for the fin assembly.

10. The heat dissipation apparatus of claim 2, further comprising a securing member located on a top of the heat conductive core, wherein the securing member comprises an elongated pressing portion extending along the major axis of the heat conductive core, a first locking leg coupled to one end of the pressing portion and a second locking leg coupled to an opposing end of the pressing portion.

11. The heat dissipation apparatus of claim 10, wherein the pressing portion comprises a pair of elongated resilient arms, the top of the heat conductive core defining a pair of elongated locating grooves along the major axis thereof for receiving the elongated resilient arms therein.

12. The heat dissipation apparatus of claim 11, where in the electronic component is mounted on a printed circuit board and surrounded by a retention frame mounted on the printed circuit board, the retention frame forming two catches on two opposite sides thereof, the first and second locking legs being for locking with the catches.

* * * * *